United States Patent [19]

Rickey et al.

[11] Patent Number: 5,099,487
[45] Date of Patent: Mar. 24, 1992

[54] LASER STRUCTURE INCLUDING COOLING ASSEMBLY

[75] Inventors: Roger J. Rickey; Anthony E. Smart, both of Costa Mesa, Calif.

[73] Assignee: The Titan Corporation, San Diego, Calif.

[21] Appl. No.: 544,689

[22] Filed: Jun. 27, 1990

[51] Int. Cl.$^5$ .................. H01S 3/13; H01L 25/04; H02B 1/00; F28F 3/14
[52] U.S. Cl. .................. 372/35; 372/34; 357/82; 361/381; 361/382; 165/170
[58] Field of Search .............. 372/34, 35, 36; 357/81, 357/82; 350/610; 361/381, 382, 385; 165/26, 169–170, 173

[56] References Cited

U.S. PATENT DOCUMENTS

| | | | |
|---|---|---|---|
| 3,923,383 | 12/1975 | Engel et al. | 350/610 |
| 4,188,996 | 2/1980 | Pellant et al. | 165/80.5 |
| 4,279,292 | 7/1981 | Swiatosz | 165/61 |
| 4,631,728 | 12/1986 | Simons | 372/38 |
| 4,752,109 | 6/1988 | Gordon et al. | 350/96.20 |
| 4,783,721 | 11/1988 | Yamamoto et al. | 361/382 |
| 4,935,864 | 6/1990 | Schmidt et al. | 363/141 |

Primary Examiner—Georgia Epps
Attorney, Agent, or Firm—Ellsworth R. Roston; Charles H. Schwartz

[57] ABSTRACT

A laser package includes a laser with first and second spaced terminals and a layer between the terminals with properties of emitting light when voltage pulses are applied between the terminals. A current of a particular magnitude is produced between the terminals in the time periods between the voltage pulses. The voltage required to produce such current is dependent upon the layer temperature. Variations in this voltage produce variations in the rate of pulses from a thermoelectric cooler included in the laser package. Variations in the rate of such pulses from the thermoelectric cooler affect the rate at which heat is withdrawn by the thermoelectric cooler from the laser. A cooler body is disposed adjacent to the thermoelectric member and is constructed to pass a cooling fluid through the cooler body to cool the thermoelectric member. The cooling fluid passes through an inlet port to a plurality of channels converging at a central recess. This causes the fluid in the recess to be turbulent, thereby increasing the rate at which heat is withdrawn from the central portion of the laser package where the temperature of the laser package is at a maximum. Because the turbulence is greatest only where it must have the highest heat transfer coefficient, the pressure drop, and hence the power necessary to pump the fluid, is minimized. The fluid then flows from the recess through a passageway to an outlet port.

29 Claims, 3 Drawing Sheets

LASER STRUCTURE INCLUDING COOLING ASSEMBLY

BACKGROUND OF THE INVENTION

This invention relates to a laser assembly and more particularly relates to apparatus for regulating the temperature of the laser in the assembly. The invention is especially concerned with apparatus for precisely regulating the temperature of a laser to obtain an optimum operation of the laser.

Lasers are being used in a progressively increasing number of applications. For example, lasers are being used to produce patterns of semiconductor circuits on integrated circuit chips. Lasers are also used as weapons to destroy enemy aircraft and missiles. Lasers are further used to determine the flight characteristics of an airborne vehicle such as an airplane. These are only a few of the many different uses of lasers.

Lasers respond to voltage inputs to produce substantially coherent light at a particular frequency. In producing such light, the lasers generate substantial amounts of heat. Such heat has to be dissipated efficiently. If the heat is not dissipated efficiently, the lasers tend to become overheated. When they become overheated, they do not operate with the same efficiency as when they are operating at a regulated temperature. For example, by maintaining the temperature of the laser constant, the wavelength of the light transmitted by the laser is maintained constant.

A considerable amount of effort has been devoted, and significant amounts of money have been expended, to regulate the temperature of a laser precisely so that an optimum operation of the laser can be maintained. Such efforts have not been entirely successful, particularly since the temperature of the laser has not been determined precisely and such determinations have been made at positions displaced from the laser. Furthermore, the removal of the heat from the laser has not been efficient.

In U.S. Pat. No. 5,046,840 filed by Anthony Smart, John Abiss and Roger Woodward on Sept. 13, 1988, for "Improvements in Apparatus for Providing for a Determination of the Movement of an Airborne Vehicle in the Atmosphere" and assigned of record to the assignee of record of this application, apparatus is disclosed and claimed for accurately determining the temperature of a laser and for regulating the temperature of the laser in accordance with such determinations. The apparatus disclosed and claimed in U.S. application Ser. No. 286,334 measures the laser temperature at the laser and determines this temperature electrically. The apparatus disclosed and claimed in U.S. Pat. No. 5,046,840 also regulates the transfer of heat from the laser in accordance with such temperature determination.

SUMMARY OF THE INVENTION

This invention provides an improvement in the apparatus of co-pending U.S. application Ser. No. 286,334 to facilitate the transfer of heat from the laser.

In one embodiment of the invention, a laser package includes a laser with first and second spaced terminals and a layer between the terminals with properties of emitting light when voltage pulses are applied between the terminals. A current of a particular magnitude is produced between the terminals in the time periods between the voltage pulses. The voltage required to produce such current is dependent upon the layer temperature. Variations in this voltage produce variations in the rate of pulses from a thermoelectric cooler included in the laser package. Variations in the rate of such pulses from the thermoelectric member affect the rate at which heat is withdrawn by the thermoelectric cooler from the laser.

A cooler body is disposed adjacent to the thermoelectric member and is constructed to pass a cooling fluid through the cooler body to cool the thermoelectric member. The cooling fluid passes through an inlet port to a plurality of channels converging at a central recess. This causes the fluid in the recess to be turbulent, thereby increasing the rate at which heat is withdrawn from the central portion of the laser package where the temperature of the laser package is at a maximum. Because the turbulence is greatest only where it must have the highest heat transfer coefficient, the pressure drop, and hence the power necessary to pump the fluid, is minimized. The fluid then flows from the recess through a passageway to an outlet port.

DESCRIPTION OF THE PREFERRED EMBODIMENTS

In one embodiment of the invention, a laser generally indicated at 18 may be constructed in a conventional manner to produce substantially coherent light at a particular frequency and to direct such light in a beam toward an object.

Figure 1:
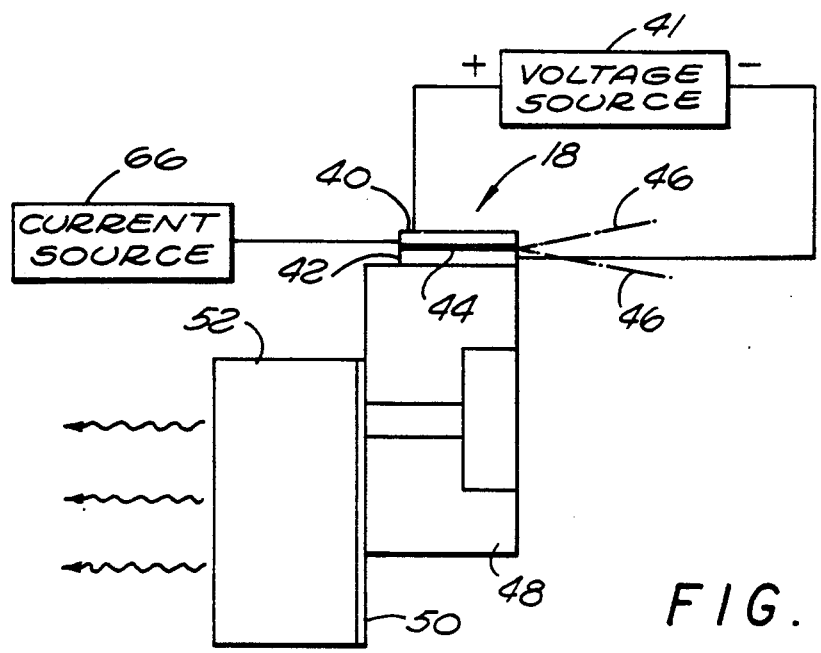
FIG. 1 is a schematic view of a laser and of members associated with the lasers for regulating the temperature of the laser.

The laser 18 may be provided with a pair of electrical terminals 40 and 42 (FIG. 1). The terminal 40 may be made from a suitable material such as gold and the terminal 42 may be made from a suitable material such as copper. A layer 44 may be disposed intermediate the terminals 40 and 44 and may be provided with a suitable thickness such as approximately two hundred microns (200 μm). The layer 44 may be made from a suitable material such as gallium arsenide.

When a positive voltage is applied to the terminal 40 from a variable voltage source 41 and a negative voltage is applied to the terminal 42 from the source, light having substantially coherent characteristics is emitted from the intermediate layer 44 at a particular frequency in a direction such as indicated at 46. It will be appreciated that this is a relatively simplified explanation since these features are well known in the art.

A heat sink 48 made from a suitable material such as copper is disposed in abutting relationship to the terminal 42 to transfer to the heat sink heat generated by the current through the intermediate layer 44. This is the Joule heating from inefficiency in the light-generating process. An electrical insulator 50 is disposed in abutting relationship with the heat sink 48 and a thermoelectric cooler 52 is in turn disposed in abutting relationship with the insulator 50. A suitable unit of the thermoelectric cooler 52 may be obtained from Marlow Industries, Inc., of Dallas, Tex.

Figure 2:
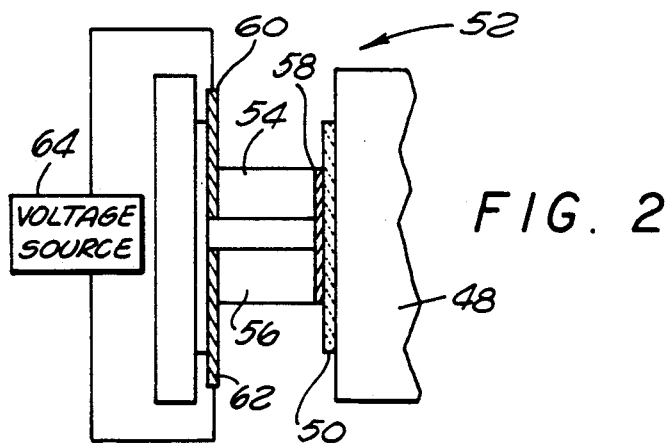
FIG. 2 is an enlarged fragmentary schematic view of certain of the members shown in FIG. 1.

The thermoelectric cooler 52 includes a pair of semiconductor members 54 and 56 (FIG. 2), the member 54 being an n-type semi-conductor such as bismuth telluride and the member 56 being a p-type semi-conductor. The members 54 and 56 are connected by a bar 58 at the end adjacent to the insulator 50. Terminals 60 and 62 are respectively attached to the semi-conductor members 54 and 56 at the end opposite the insulator 50. A source 64 of electrical pulses is connected between the terminals 60 and 62. The source 64 is adapted to produce pulses having an adjustable rate and fixed duration under the control of the voltage from the source 64. Alternatively, the source 64 is adapted to produce pulses having a fixed rate and a variable duration under the control of the voltage from the source 64.

As previously described, the laser 18 is constructed in a conventional manner to produce substantially coherent light at a particular frequency. This causes the laser 18 to generate heat. This heat is dissipated by the heat sink 48.

The laser 18 is periodically turned off for a small period of time. When the laser 18 is turned off, a current source 66 (FIG. 1) is connected to the terminal 40 to produce a flow of a current of a low magnitude through the terminals 40 and 42 and the intermediate layer 44. For example, the current may have a suitable value such as approximately one milliampere (1 mA). The voltage required to produce this current varies in accordance with the temperature at the intermediate layer 44.

Figure 3:
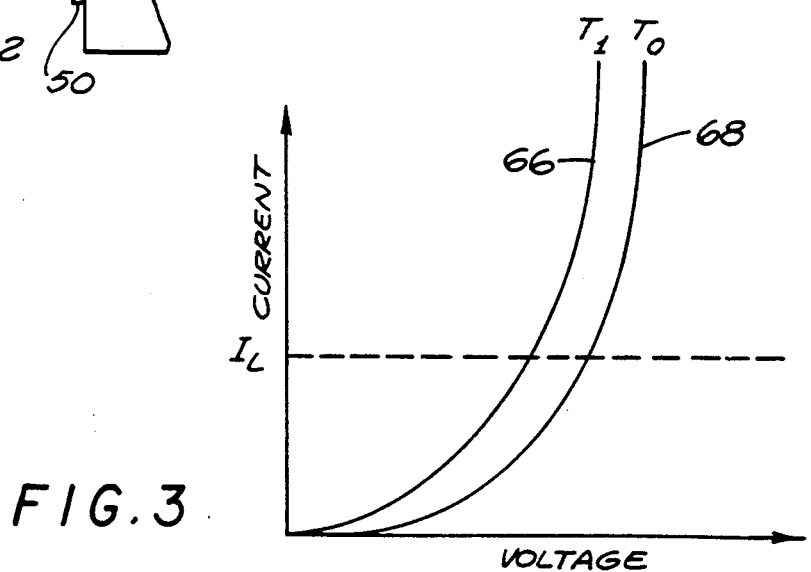
FIG. 3 is a graph schematically illustrating the regulating action of the temperature regulator shown in FIGS. 1 and 2.
Figure 4:
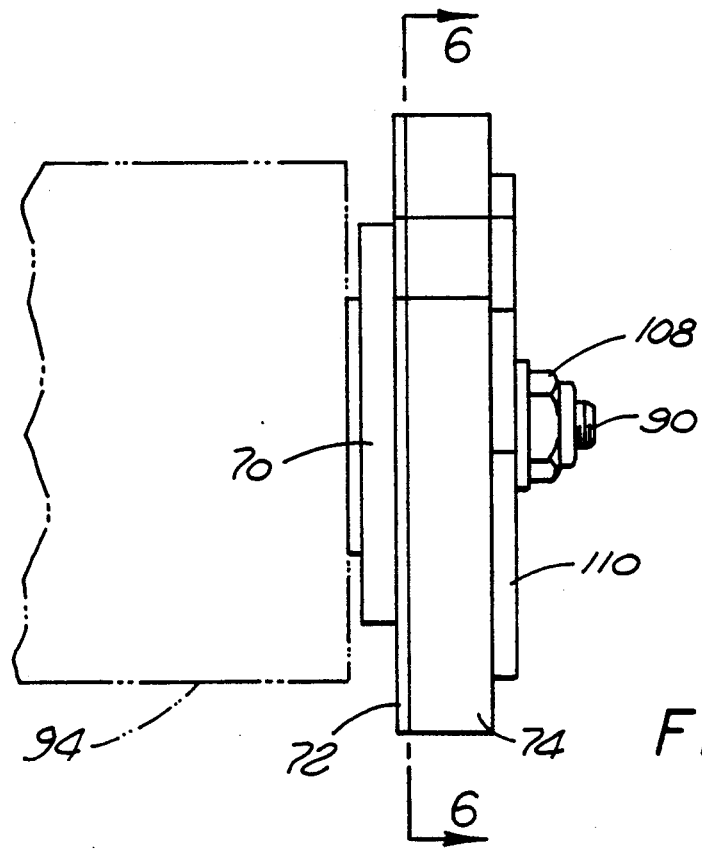
FIG. 4 is a front elevational view of a view of a laser package including the members shown in FIGS. 1 and 2 and of apparatus associated with the laser package to cool the laser package.

The interrelationship between the temperature of the laser at the intermediate layer 44 and the voltage required to produce the current of the particular value such as approximately one milliampere (1 mA) is illustrated in FIG. 3. This current is illustrated at $I_L$ in FIG. 3. In FIG. 3, the current through the intermediate layer 44 is illustrated along the vertical axis and the voltage for producing this current is shown along the horizontal axis. In FIG. 3, the relationship between current and voltage for a temperature $T_1$ is illustrated at 66 and the relationship between current and voltage for a temperature $T_0$ is illustrated at 72 in FIG. 3.

For an "ideal" diode, the relationship between voltage, current and temperature is given by the equation $$I_L = I_0 e^{\frac{qV}{KT}} \quad (1)$$

In the above equation,
- $I_0$ = a constant since it constitutes a predetermined current such as one milliampere (1 mA);
- $K$ = a constant; and
- $q$ = a constant.

Equation (1) can be rewritten as $$V_D = \frac{kT}{q} \log I_L/I_0 \quad (2)$$

This can be further rewritten as $$T = \frac{V_D q}{K \log I_L/I_0} \quad (3)$$

As will be seen, the temperature of the laser is related to the voltage required to produce the current of one milliampere (1 mA) through the laser.

Dependent upon the voltage produced for a current of one milliampere, the rate at which pulses are produced by the source 64 is varied to maintain the desired temperature in accordance with the graphs shown in FIG. 3. These pulses are introduced to the thermoelectric cooler 52 to obtain the flow of current through the semi-conductor members 54 and 56. This flow of current causes the junction of the thermoelectric cooler 52 adjacent the insulator 50 to have a higher temperature then the junction of the thermoelectric cooler adjacent to the terminals 60 and 62. Heat accordingly flows through the thermoelectric cooler 52 in a direction away from the heat sink 48.

As will be appreciated, the difference in temperature between the two junctions in the thermoelectric cooler 52 is dependent upon the rate at which the pulses are introduced by the source 64 to the thermoelectric cooler. For example, as the temperature at the intermediate layer 44 increases, the rate of introduction of pulses from the source 64 to the thermoelectric cooler 52 increases. This causes the thermoelectric cooler 52 to transfer an increased amount of heat from the heat sink 48. In this way, the controlled operation of the thermoelectric cooler 52 causes the temperature at the intermediate layer 44 of the laser 18 to be regulated.

The apparatus described above is disclosed and claimed in U.S. Pat. No. 5,046,840. The apparatus shown in FIGS. 4-7 and described subsequently is adapted to be used in conjunction with the apparatus shown in FIGS. 1-3 to provide an enhanced transfer of heat from the laser and an enhanced regulating action in such heat transfer. The apparatus shown in FIGS. 4-7 is particularly adapted to cool the side of the thermoelectric cooler 52 adjacent to the terminals 60 and 62 so that the thermoelectric cooler can control the temperature of the intermediate layer 44.

In the apparatus shown in FIGS. 4-7, the thermoelectric cooler 52 is included in a laser package 70 (FIGS. 4 and 7) with the laser 18. In this arrangement, the terminals 60 and 62 are disposed adjacent a cover plate 72 (FIGS. 4 and 7) which closes a cooler body 74. The cover plate 72 and the cooler body 74 are preferably soldered together to form a single unit. The cooler body 74 has an inlet port 76 (FIGS. 5 and 6) for introducing into a passageway 78 (FIG. 6) a cooling fluid which may be a 50—50 mixture of ethylene glycol and water.

Figure 5:
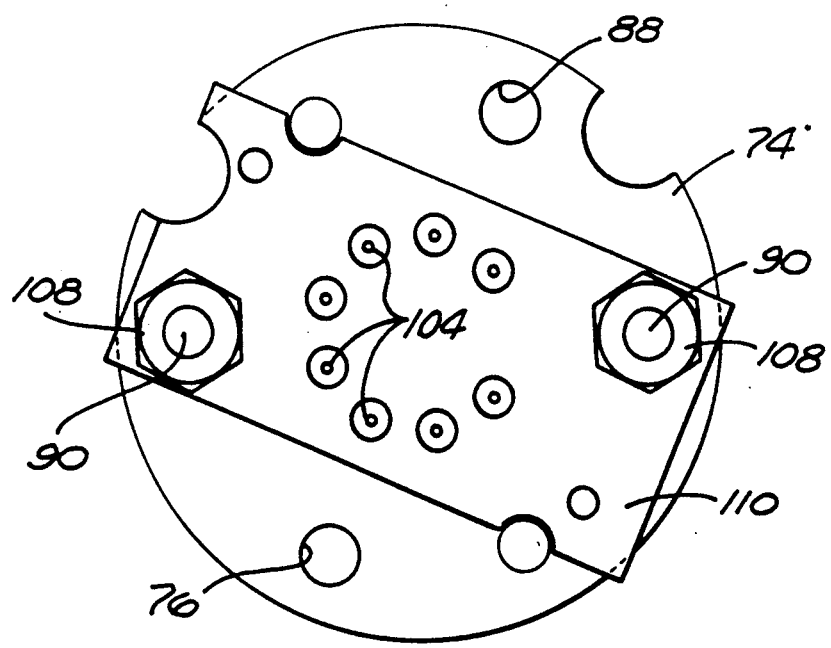
FIG. 5 is a plan view of the cooling apparatus shown in FIG. 4.
Figure 6:
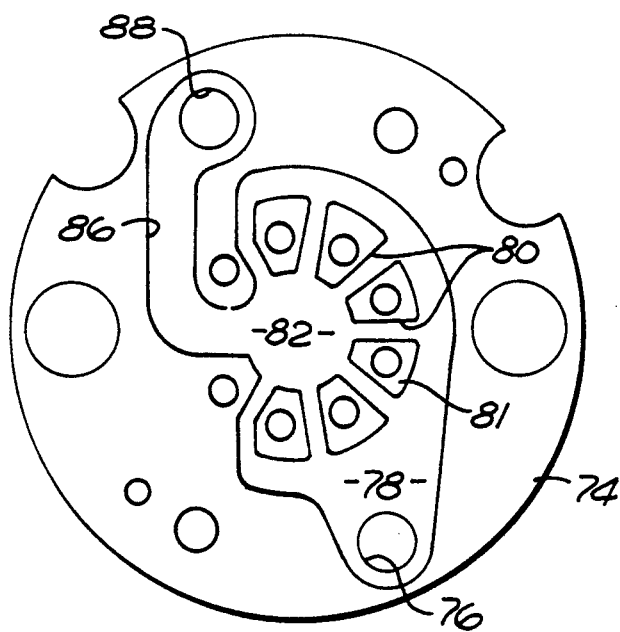
FIG. 6 is a sectional view of the cooling apparatus and is taken substantially on the line 6—6 of FIG. 4.

The passageway 78 communicates with a plurality of radial channels 80 (FIG. 6) which are defined by raised islands 81 and are preferably radially disposed to introduce the cooling fluid into a centrally disposed recess 82. Preferably the width of the channels increases slightly with progressive positions towards the centrally disposed recess 82. By introducing the cooling fluid from the plurality of converging channels 80 into the centrally disposed recess 82, the fluid in the recess 82 becomes turbulent. This facilitates the transfer of heat from the central portion of the laser package 70 where most of the heat from the laser accumulates. The fluid then flows through a passageway 86 to an outlet port 88 (FIGS. 5 and 6). It will be appreciated that the fluid can also flow from the outlet port 88 to the inlet port 76 without departing from the scope of the invention. The efficiency of the cooling system can be enhanced by adding additional fins in the passageway 78 and/or the passageway 86.

As will be appreciated, it is desirable to maintain the temperature at the terminals 60 and 62 (FIG. 2) relatively low so that a temperature difference can be produced between these terminals and the junction of the thermoelectric cooler 52 adjacent the insulator 50, which is also included in the laser package 70. The flow of the cooling fluid through the cooler body 74 (FIGS. 4 and 7) causes the temperature of the thermoelectric cooler 52 adjacent the terminals 60 and 62 to be reduced so that the thermoelectric cooler 52 can operate efficiently to regulate the temperature of the laser 18.

Figure 7:
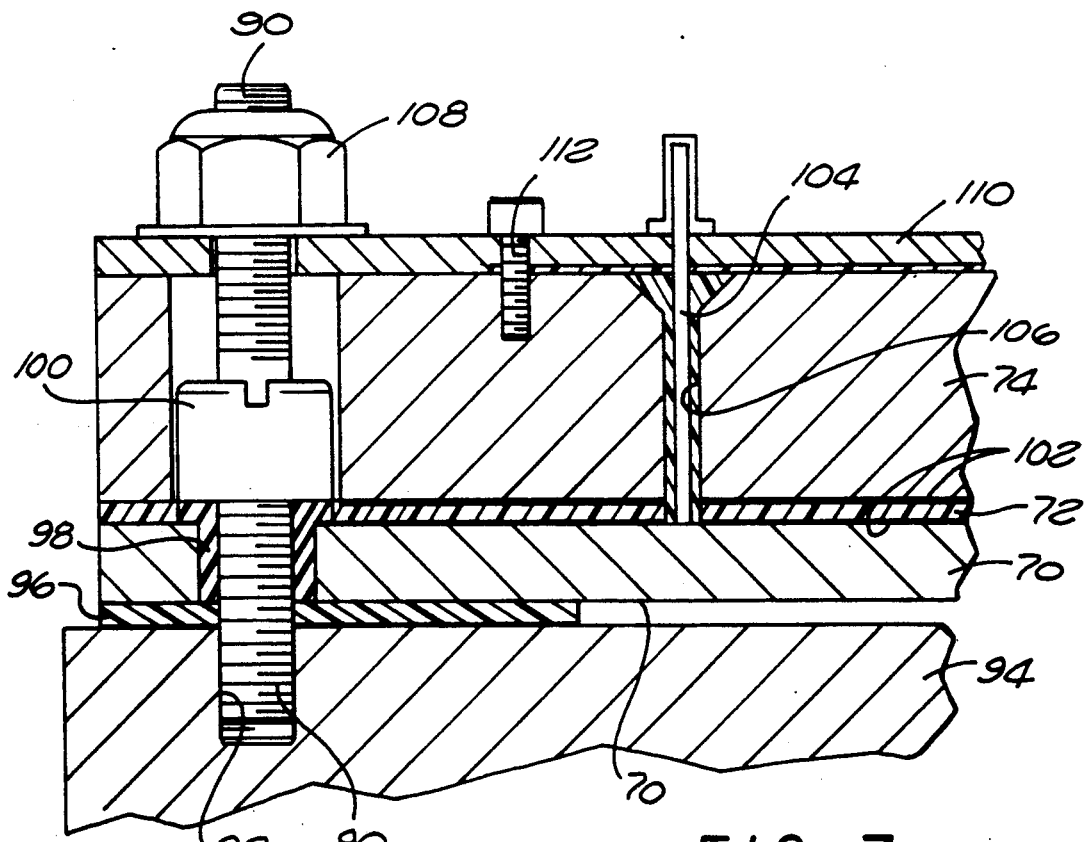
FIG. 7 is a sectional view of the cooling apparatus and the laser package and illustrates how the cooling apparatus is attached to the laser package.

The laser package 70, the cover plate 72 and the cooler body 74 (FIGS. 4 and 7) can be assembled in a relationship as shown in FIG. 7. A threaded bolt 90 (FIG. 7) extends through a hole in the laser package 70 into a socket 92 in a support member 94. A washer assembly formed from a flat washer 96 and a shoulder washer 98 is disposed around the laser package 70 to protect and position the laser package. A retaining nut 100 threaded on the bolt 90 retains the laser package 70 and the washer assembly in a fixed relationship to the support member 94.

The cover plate 72 is disposed in contiguous relationship to the laser package 70. A thermally conducting (preferably electrically isolating) gel 102 (FIG. 7) is disposed between the laser package 70 and the cover plate 72 and between the cover plate 72 and the cooler body 74, which is permanently attached to the cover plate 72 as by solder to prevent fluid leakage. The gel 102 facilitates the transfer of heat from the laser package 70 to the cooler body 74. A plurality of leads 104 (FIG. 7) extend through sockets 106 in the cooler body to the laser 18 in the laser package 70. These leads introduce electrical energy to the laser 18 to energize the laser and the thermoelectric coolers. The cooler body 74 is retained in a fixed relationship to the support member 94 as by a retaining nut 108 threaded on the bolt 90. A connector plate such as a printed circuit board 110 is retained in contiguous relationship to the cooler body 74 as by a threaded stud 112 and the nut 108.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:
1. In combination,
laser means including a laser for emitting light and for becoming heated when emitting light, the heat being primarily concentrated at the central portion of the laser, and
cooler means having a construction and a disposition relative to the laser means for providing for an inflow of a fluid at one end of the cooler means and for providing for an out-flow of the fluid at the other end of the cooler means and for providing for a turbulence of the fluid at the central portion of the cooler means and for removing the heat at the central portion of the laser means.

2. In a combination as set forth in claim 1,
the laser having leads for introducing energy to the laser for obtaining an operation of the laser to emit light,
the cooler means having a construction for defining channels communicating with the central portion of the cooler means and for introducing the fluid to the central portion of the cooler means and for generating turbulence of the fluid in the central portion of the cooler means to facilitate the cooling of the central portion of the laser means.

3. In a combination as set forth in claim 2,
there being raised and spaced islands defining the channels with progressively increasing width, each of the channels communicating with a centrally disposed recess for creating turbulence of the fluid in the recess and the recess communicating with an outlet passageway for directing the fluid from the centrally disposed recess.

4. In a combination as set forth in claim 3,
there being an inlet port in communication with the channels for introducing the fluid to the cooler means and an outlet port communicating with the outlet passageway to remove the fluid from the cooler means.

5. In combination,
laser means including a laser having first and second spaced terminals and a layer between the terminals for obtaining the emission of light from the layer when a voltage is applied between the first and second terminals,
recessed cooler means for introducing fluid into the cooler means for the flow of fluid from a first end of the cooler means through the central portion of the cooler means to the other end of the cooler means with the fluid in a turbulent state in the central portion of the cooler means to facilitate the removal of heat in the central portion of the laser means,
thermoelectric means included in the laser means and disposed adjacent the cooler means for providing a transfer of a variable amount of heat from the laser means to the thermoelectric means, and
control means responsive to the temperature at the laser means for regulating the transfer of heat from the laser means to the thermoelectric means to maintain the temperature of the laser means at a particular value,
the cooler means being disposed in contiguous relationship to the thermoelectric means for cooling the thermoelectric means.

6. In a combination as set forth in claim 5,
the cooler means having a construction for introducing the fluid into the cooler means at the first end of the cooler means and for directing the fluid through a plurality of converging channels into a recess at the central portion of the laser means for the creation of the turbulence in the recess and for channeling the fluid from the recess to the other end of the cooling means for the passage of the fluid from the other end of the cooling means.

7. In a combination as set forth in claim 6,
the control means having a construction for producing pulses at a variable rate dependent upon variations in the temperature in the laser means, the cooler means including means for providing for the withdrawal of heat by the thermoelectric means from the laser means at a variable rate dependent upon the variable rate of the pulses.

8. In a combination as set forth in claim 7, the control means including means for producing a current at a particular amplitude between the first and second terminals and for determining the voltage required to produce such current and further including means responsive to the variations in the voltage for regulating the heat withdrawn by the thermoelectric means for the laser.

9. In combination, laser means including a laser having first and second spaced terminals and a layer of a material between the spaced terminals, the layer of the material having properties of emitting light when a voltage is produced between the first and second terminals, first means for providing pulses of voltage between the first and second terminals to obtain an emission of light from the laser means and a heating of the laser as a result of such pulsed emission, the heating of the laser occurring primarily at the center of the laser, second means included in the laser means for providing a controlled transfer of heat from the laser means, third means disposed adjacent the second means for passing a fluid through the third means to obtain a cooling of the laser primarily at the center of the laser, and fourth means responsive to variations in the temperature of the laser for regulating the heat transferred from the laser by the second means to maintain the temperature of the laser at a particular value.

10. In a combination as recited in claim 9, the third means having a construction for passing the fluid through the third means in a direction substantially parallel to the first and second terminals and the light emitting layer in the laser and for creating a turbulence of the fluid in the third means at a position adjacent the central region of the laser.

11. In a combination as recited in claim 9, the second means having a construction for producing pulses of energy at a variable rate and for transferring heat from the laser at a variable rate dependent upon the rate of the pulses, and the fourth means having a construction for controlling the rate at which the pulses of energy are produced by the second means in accordance with the temperature of the laser.

12. In a combination such as set forth in claim 11, the third means having cuts for defining a plurality of channels for passing fluid to a central region in directions for creating turbulence in the central region and for thereafter directing the fluid from the central region, the second means having a construction for producing pulses of energy at a variable rate and for transferring heat from the laser at a variable rate dependent upon the rate of the pulses, and the fourth means having a construction for controlling the rate at which the pulses of energy are produced by the second means in accordance with the temperature of the laser.

13. In combination, laser means including a laser having properties of emitting light and of becoming heated when emitting light, first means associated with the laser for determining, at the laser, the temperature of the laser, second means associated with the laser means for passing a fluid through the second means in a direction parallel to the laser for cooling the laser means, and third means responsive to the temperature at the laser for providing for the passage of heat from the laser at a rate dependent upon the temperature of the laser and for maintaining the temperature of the laser at a particular value.

14. In a combination as set forth in claim 13, the second means having a construction for directing the fluid through the second means and for increasing the rate at which heat is transferred from the central portion of the laser relative to the rate at which heat is transferred from other portions of the laser other than the central portion of the laser.

15. In a combination as set forth in claim 14, the second means having a construction for directing the fluid through a multiple number of spaced paths converging into the central portion of the second means and for producing turbulence of the fluid in the central portion of the second means and for increasing the amount of heat transferred from the laser to the second means in the central portion of the laser.

16. In a combination as set forth in claim 15, the fourth means having a construction for periodically determining, at the laser, the temperature of the laser and for regulating the passage of the heat from the laser in accordance with such periodic determinations and for maintaining the temperature of the laser at the particular value.

17. In a combination as set forth in claim 16, the fourth means including means responsive to the periodic determinations of the temperature of the laser means for producing pulses at a variable rate dependent upon such periodic determinations and further including means responsive to the variable rate of the pulses for withdrawing heat from the laser at a rate dependent upon the variations in the rate of the pulses to maintain the temperature of the laser at the particular value.

18. In combination, laser means including a laser having a plurality of leads for receiving power and for becoming energized to emit light, and cooler body means disposed in contiguous relationship to the laser means and having a plurality of holes for passing the laser leads to the laser, the cooler body means having an inlet port for receiving a cooling fluid and having a plurality of converging channels in communication with the inlet port and having a centrally disposed recess in communication with the channels for receiving the cooling fluid from the channels in a turbulent state and for facilitating the transfer of heat from the laser to the cooler body means in the central portion of the laser and having a passageway in communication with the recess for transferring the fluid from the recess and having an outlet port in communication with the passageway for transferring the cooling fluid from the cooler body means.

19. In a combination as set forth in claim 18, a retaining member,
means extending through the cooler body means for retaining the laser means and the cooler body means in a fixed relationship to the retaining member.

20. In a combination as set forth in claim 19,
a connector plate for providing electrical connections to the laser, and
means for retaining the connector plate in a fixed relationship to the cooler body means.

21. In a combination as set forth in claim 20,
a thermally conducting, electrically insulating gel disposed between the cooler body means and the laser means for facilitating the transfer of heat from the laser means to the cooler body means.

22. In a combination as set forth in claim 18,
the cooler body means including a cooler body and a cover, the cover being disposed in contiguous relationship to the laser means.

23. In combination,
laser means having a plurality of leads for receiving electrical power and for becoming energized to transmit light,
cooler means disposed in contiguous relationship to the laser means and having a plurality of holes for passing the laser leads to the laser means, the cooler means having an inlet port for receiving a cooling fluid and having a plurality of converging channels in communication with the inlet port and having a centrally disposed recess in communication with the channels for providing for the reception at the centrally disposed recess of the cooling fluid from the channels in a turbulent state and for facilitating the transfer of heat from the laser means to the cooler means and having a passageway in communication with the recess for transferring the fluid from the recess and having an outlet port in communication with the passageway for transferring the cooling fluid from the cooler means,
first means included in the laser means for providing a controlled transfer of heat from the laser means, and
second means for regulating the amount of the heat passed from the laser means to maintain the temperature of the laser means at a particular value.

24. In a combination as set forth in claim 23,
the cooler means including a cooler body and a cover, the cover being disposed in contiguous relationship to the laser means.

25. In a combination as set forth in claim 23,
the second means having a construction for periodically determining, at the laser means, the temperature of the laser means and for regulating the passage of the heat from the laser means in accordance with such periodic determination and for maintaining the temperature of the laser means at the particular value.

26. In a combination as set forth in claim 25,
the first means including means responsive to the periodic determination of the temperature of the laser means for producing pulses at a variable rate dependent upon such periodic determinations and further including means responsive to the variable rate of the pulses for withdrawing heat from the laser means at a rate dependent upon the variations in the rate of the pulses to maintain the temperature of the laser means at the particular value.

27. In a combination as set forth in claim 25,
a retaining member,
means extending through the cooler means for retaining the laser means and the cooler means in a fixed relationship to the retaining member.

28. In a combination as set forth in claim 26,
a retaining body,
means extending through the cooler means for retaining the laser means and the cooler means in a fixed relationship to the retaining body,
a connector plate for providing electrical connections to the laser means, and
means for retaining the connector plate in a fixed relationship to the cooler means.

29. In a combination as set forth in claim 28,
a thermally conducting, electrically insulating gel disposed between the cooler means and the laser means for facilitating the transfer of heat from the laser means to the cooler means.

* * * * *